(12) United States Patent
Park

(10) Patent No.: US 7,129,143 B2
(45) Date of Patent: Oct. 31, 2006

(54) SEMICONDUCTOR DEVICES HAVING DUAL SPACERS AND METHODS OF FABRICATING THE SAME

(75) Inventor: Jeong Ho Park, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/971,984

(22) Filed: Oct. 22, 2004

(65) Prior Publication Data

US 2005/0087802 A1  Apr. 28, 2005

(30) Foreign Application Priority Data

Oct. 23, 2003  (KR) .................. 10-2003-0074451

(51) Int. Cl.
*H01L 21/336* (2006.01)
(52) U.S. Cl. ............... 438/305; 438/303; 257/E21.248
(58) Field of Classification Search ............... 438/303, 438/305, 306; 257/E21
See application file for complete search history.

(56) References Cited

U.S. PATENT DOCUMENTS

| | | | |
|---|---|---|---|
| 5,668,021 A * | 9/1997 | Subramanian et al. ...... 438/282 |
| 5,856,226 A | 1/1999 | Wu | |
| 5,981,346 A * | 11/1999 | Hopper ........................ 438/304 |
| 6,001,695 A | 12/1999 | Wu | |
| 6,100,561 A | 8/2000 | Wang et al. ................. 257/344 |
| 6,124,177 A * | 9/2000 | Lin et al. ..................... 438/305 |
| 6,214,677 B1 | 4/2001 | Lee | |
| 6,562,687 B1 | 5/2003 | Deleonibus et al. | |
| 6,998,318 B1 | 2/2006 | Park | |
| 2002/0025638 A1 | 2/2002 | Yeh et al. | |

\* cited by examiner

*Primary Examiner*—Bradley K. Smith
(74) *Attorney, Agent, or Firm*—Andrew D. Fortney

(57) ABSTRACT

Semiconductor devices and methods of making the same are disclosed. According to one example, a semiconductor device having dual spacer may include a semiconductor substrate, a gate oxide film and a gate poly provided in a device region of the semiconductor substrate, a halo/pocket implant region formed in a region of the semiconductor substrate by which the gate poly is defined, and an inner spacer formed at a side wall of the gate poly for defining the width of a lower portion of the gate poly. The semiconductor device may also include an outer spacer formed at the side wall of the gate poly for defining the width of an upper portion of the gate poly, source/drain regions provided on the semiconductor substrate under the gate oxide film, and a salicide film provided on surfaces of the gate poly and the source/drain region.

20 Claims, 3 Drawing Sheets

SEMICONDUCTOR DEVICES HAVING DUAL SPACERS AND METHODS OF FABRICATING THE SAME

TECHNICAL FIELD

The present disclosure relates to semiconductor devices and, more particularly, semiconductor device having dual spacers and methods of fabricating the same.

BACKGROUND

With increased integration and operation speed of semiconductor devices, new semiconductor device fabrication technologies are actively being studied. For high operation speed of semiconductor devices, it is required to minimize the length of a path along which electrons move when a transistor is turned on. To this end, studies of a short channel transistor whose channel length, which is the distance between a source and a drain of the transistor, is reduced are being carried out. In addition, studies regarding the use of salicide for minimizing contact resistance between the gate of the transistor and subsequent wires are being progressed.

FIG. 1 is a schematic diagram illustrating a configuration of a conventional semiconductor device. As shown in FIG. 1, a gate oxide film 102 and a gate poly 104 are formed in a device region of a semiconductor substrate 100, and a spacer 106 made of an insulation film is formed on a side wall of the gate poly 104. In addition, a Lightly Doped Drain (LDD) 108, in which impurities of a conductivity type opposite to a conductivity type of the semiconductor substrate 100 are lightly doped, is formed on the semiconductor substrate 100 under the gate oxide film 102. Source/drain regions 110 in which impurities of the same conductivity type as the LDD 108 are heavily doped are formed at a junction region of the semiconductor substrate 100 contacting with the LDD 108. In addition, a salicide film 112 for lowering contact resistance is formed on the gate poly 104 and the source/drain regions 110.

With the semiconductor device as configured above, for high operation speed of the transistor, the channel length between a source electrode and a drain electrode of the transistor should be reduced, as described above, and consequently, the width of the gate poly should be reduced. However, when the width of the gate poly is reduced, a serious narrow line effect may occur. Due to this effect, it is not easy to form the salicide on the gate poly. Accordingly, the conventional short channel transistor has a problem in that a characteristic of the transistor is deteriorated due to increased gate resistance.

As conventional solutions to overcome this problem, U.S. Pat. No. 6,100,561 discloses a method for forming LDD CMOS using double spacers and large-tilt-angle ion implantation and U.S. Pat. No. 6,214,677 discloses a method of fabricating a self-aligned ultra short channel.

DETAILED DESCRIPTION OF THE PREFERRED EMBODIMENT

As disclosed herein, a semiconductor device constructed in accordance with the disclosed methods includes a short channel transistor having a gate area in which salicide is formed.

Figure 1:
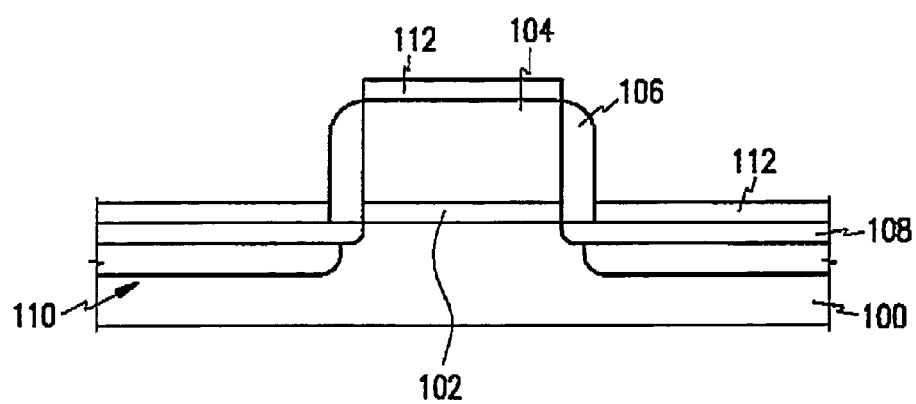
FIG. 1 is a schematic diagram illustrating a configuration of a conventional semiconductor device.
Figure 2:
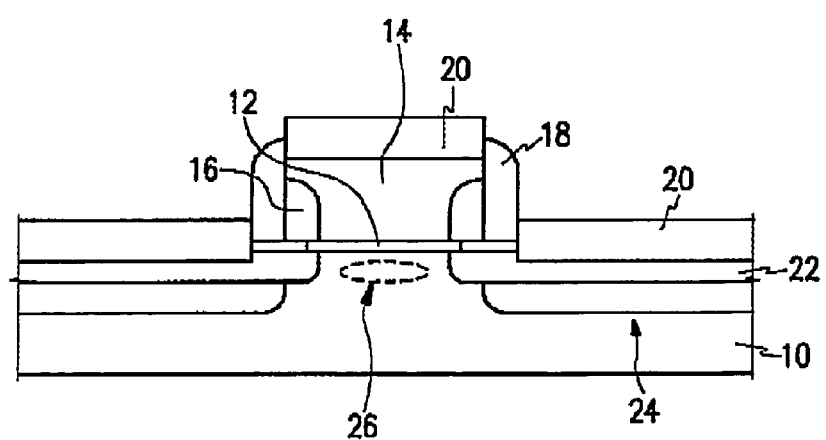
FIG. 2 is a schematic diagram illustrating a configuration of a disclosed semiconductor device.

Referring to FIG. 2, a gate oxide film 12 and a gate poly 14 are formed in a device region of a semiconductor substrate 10, and an inner spacer 16 made of a nitride film and an outer spacer 18 are formed on a side wall of the gate poly 14.

Herein, the outer spacer 18 defines the width of an upper portion of the gate poly 14 and the inner spacer 16 defines the width of a lower portion of the gate poly 14. To this end, the inner space 16 is provided inside the outer spacer 18 and is formed to be lower than the outer spacer 18. Accordingly, the upper portion of the gate poly 14 is formed to be wider than the lower portion of the gate poly 14. This prevents the area where a salicide 20 is to be formed from being reduced.

In addition, an LDD 22 in which impurities of a conductivity type opposite to a conductivity type of the semiconductor substrate 10 are lightly doped is formed on the semiconductor substrate 10 under the gate oxide film 12, and source/drain regions 24 in which impurities of the same conductivity type as the LDD 22 are heavily doped are formed at a junction region of the semiconductor substrate 10 contacting with the LDD 22. A halo/pocket implant region 26 is formed between the source/drain regions 24. A final profile of the source/drain regions 24 after performing a thermal treatment process is shown in FIG. 2. The halo/pocket implant region 26 serves to prevent impurities doped into the source/drain regions from being diffused into a channel region under a gate electrode. Accordingly, it can be prevented that an electrical characteristic of the semiconductor device is deteriorated due to the diffusion of the impurities into the channel region.

In other words, as disclosed herein, because the impurities can be prevented from being diffused into the channel region, a conventional problem can be solved that it is difficult to distinguish between turn-on operation and turn-off operation of the semiconductor device as a threshold voltage is varied due to the diffusion of the impurities into the channel region, and consequently, malfunction of the semiconductor device may occur and leakage current may be increased.

In addition, a salicide film 20 made of cobalt, titanium, nickel, etc. for lowering contact resistance is formed on the gate poly 14 and the source/drain regions 24. At this time, because the upper portion of the gate poly 14 is formed to be wider than the lower portion of the gate poly 14, the salicide film 20 can be easily formed on the gate poly 14. Accordingly, the problem of deterioration of the characteristic of the device due to the increase of gate resistance can be solved.

Figure 3A:
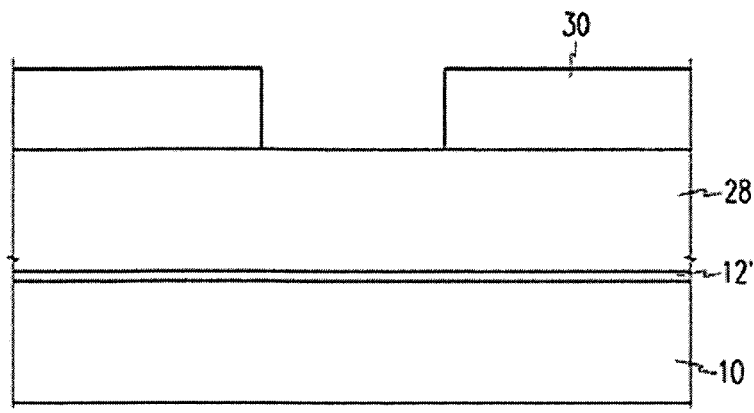
FIGS. 3a to 3f are diagrams showing the semiconductor device of FIG. 2 at various stages of fabrication.

Hereinafter, an example method of fabricating the semiconductor device as constructed above will be described with reference to FIGS. 3a to 3f. As shown in FIG. 3a, a first insulation film 12' and a second insulation film 28 are first deposited at a certain thickness on the semiconductor substrate, and a photoresist is applied on the second insulation film 28 and then is exposed and developed to form a damascene mask pattern 30. The second insulation film 28 may be made of one selected from a group consisting of TEOS, MTO, USG and SiH$_4$-rich oxide.

Figure 3B:
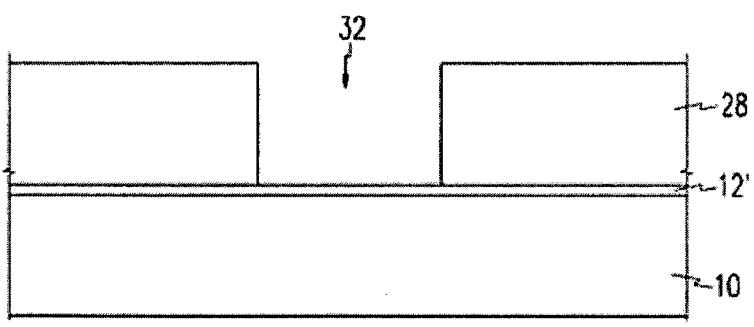

Subsequently, as shown in FIG. 3b, an opening 32 is formed by dry-etching the second insulation film 28 using the damascene mask pattern 30 as a mask, and then the damascene mask pattern 30 is removed.

Figure 3C:
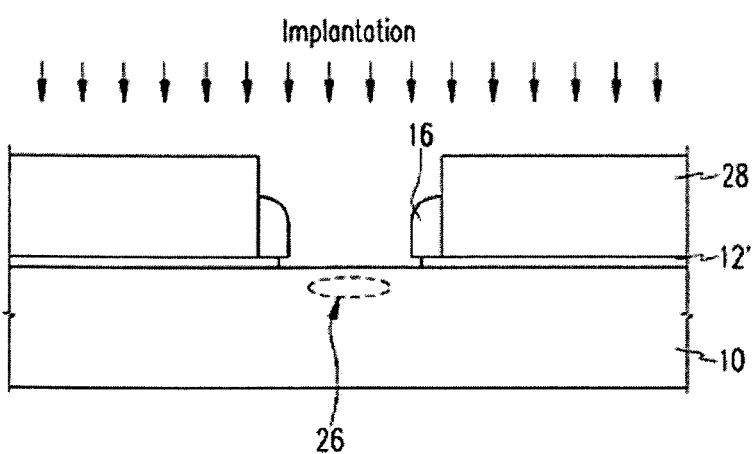

Successively, as shown in FIG. 3c, the inner spacer 16 is formed on an inner wall of the opening 32. More specifically, the inner spacer 16 can be formed by depositing a nitride film on the inner wall of the opening 32 and then etching the entire surface of the nitride film. In this entire surface etching process, a portion of the first insulation film 12' at the bottom of the opening 32 is removed.

Although according to one example the portion of the first insulation film 12' disposed under an inside space of the inner spacer 16 is removed when the inner spacer 16 is formed using the entire surface etching process, this is not essential.

After forming the inner spacer 16 as described above, the halo/pocket implant region 26 is formed in the semiconductor substrate 10 under the opening 32 using an implantation method.

Figure 3D:
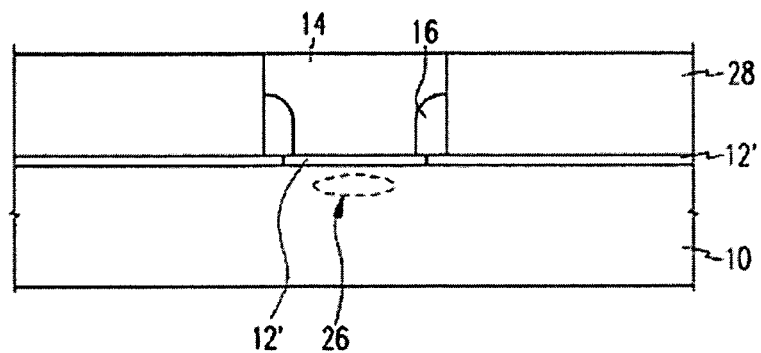

Subsequently, as shown in FIG. 3d, the first insulation film 12' is again deposited in a portion where the first insulation film has been removed, and a polysilicon film is deposited thereon using a chemical vapor deposition (CVD) method and then is planarized until the second insulation film 28 is exposed using a chemical mechanical polishing (CMP) method. As a result, the gate poly 14 whose upper portion is wider than its lower portion is formed.

Figure 3E:
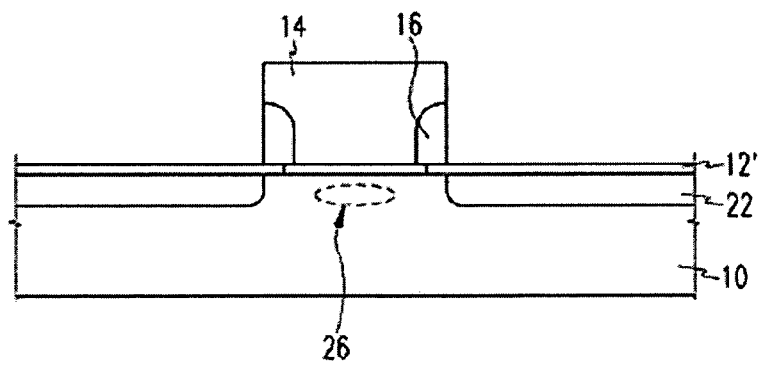

Next, as shown in FIG. 3e, the second insulation film 28 is removed by performing a wet etching process using solution containing HF (49%):$H_2O$ or $NH_4F$:HF and then the LDD 22 is formed on the semiconductor substrate 10 using the inner spacer 16 and the gate poly 14 as a mask.

Figure 3F:
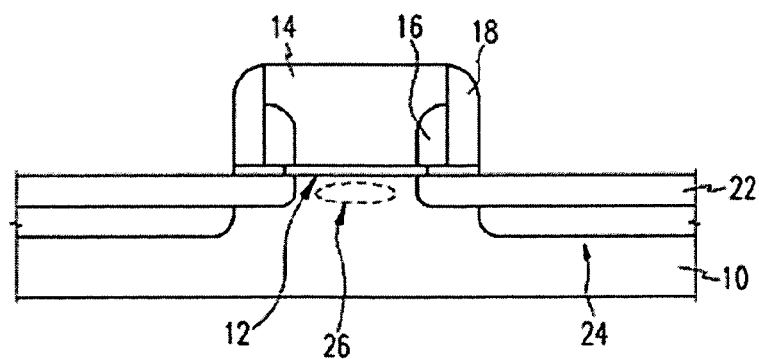

Subsequently, as shown in FIG. 3f, the outer spacer 18 is formed on side walls of the inner spacer 16 and the gate poly 14. In this case, the outer spacer 18 can be formed by depositing a nitride film or an oxide film on the side walls of the inner spacer 16 and the gate poly 14 and patterning the nitride film or the oxide film using an entire surface etching process.

The first insulation film 12' surrounding the outer spacer 18 is removed when the entire surface etching process is performed, thereby forming the gate oxide 12. After forming the gate oxide 12 as described above, the source/drain regions 24 are formed using the inner and outer spacers 16 and 18 and the gate poly as a mask, and then the salicide film 20 is formed on surfaces of the gate poly 14 and the source/drain regions 24, as shown in FIG. 2.

Herein, the salicide film 20 is formed by forming a metal film such as cobalt, titanium or nickel on the entire surface of the semiconductor including the gate poly 14 and the spacers 16 and 18 using a sputtering process, performing a rapid thermal annealing (RTA) process for the semiconductor substrate 10, and selectively removing a portion of the metal film, which does not react with silicon of the semiconductor substrate, using wet etchant.

Although not shown, after the salicide film 20 is formed, a PMD is deposited and planarized on the entire surface of the semiconductor substrate 10 and the PDM is selectively etched to form a contact hole. After that, a tungsten plug is formed in the contact hole to thereby form a contact for electrically connecting device electrodes to metal wire layers. Finally, for completing the semiconductor device, a metal film is deposited and patterned on the PMD to thereby form a metal wire layer consisting of the patterned metal film connected to the tungsten plug.

As is apparent from the above description, because the width of the gate poly can be sufficiently secured in order to form the salicide film, the short channel transistor can be fabricated using a damascene process without purchasing additional equipments, and the narrow line effect, which may occur due to the reduction of the width of the gate poly in the short channel transistor, can be suppressed. Accordingly, since the salicide film is easily formed on the gate poly, the problem can be solved that the device characteristic is deteriorated due to the increase of the gate resistance.

This application makes reference to, incorporates the same herein, and claims all benefits accruing under 35 U.S.C. §119 from an application entitled "Semiconductor Device with Dual Space and Method for Manufacturing the Same" filed in the Korean Industrial Property Office on Oct. 23, 2003, and there duly assigned Ser. No. 10-2003-0074451.

Disclosed herein are short channel transistors that are capable of sufficiently securing a gate area in which salicide is formed. Methods for fabricating the same are also disclosed.

An example semiconductor device constructed in accordance with the foregoing may include a semiconductor substrate, a gate oxide film and a gate poly provided in a device region of the semiconductor substrate, a halo/pocket implant region formed in a region of the semiconductor substrate by which the gate poly is defined, and an inner spacer formed at a side wall of the gate poly and defining the width of a lower portion of the gate poly. The example device may also include an outer spacer formed at the side wall of the gate poly and defining the width of an upper portion of the gate poly, source/drain regions provided on the semiconductor substrate under the gate oxide film, and a salicide film provided on surfaces of the gate poly and the source/drain region.

In one particular example, the inner spacer is formed to be lower than the outer spacer such that the width of the upper portion of the gate poly is wider than the width of the lower portion of the gate poly. Additionally, the halo/pocket implant region serves to prevent impurities, for example, boron (B) or phosphor (P), doped into the source/drain regions from being diffused into a channel region under a gate electrode when the impurities are heat-treated. Accordingly, it can be prevented that an electrical characteristic of the semiconductor device is deteriorated due to the diffusion of the impurities into the channel region. In other words, a problem can be solved that it is difficult to distinguish between turn-on operation and turn-off operation of the semiconductor device as a threshold voltage is varied due to the diffused impurities, and consequently, malfunction of the semiconductor device may occur and leakage current may be increased.

An example method of fabricating such a device includes depositing first and second insulation films on a semiconductor substrate sequentially and patterning the second insulation film to form an opening, forming an inner spacer on an inner wall of the opening, depositing a polysilicon on the opening and forming a gate poly by planarizing the polysilicon, and removing the second insulation film and forming an LDD using the gate poly and the inner spacer as a mask. The method may also include forming an outer spacer on side walls of the gate poly and the inner spacer, forming source/drain regions using the gate poly and the outer spacer as a mask, and forming a salicide film on the gate poly and the source/drain regions.

According to one arrangement, the inner spacer is formed to be lower than the outer spacer such that the width of an upper portion of the gate poly is wider than the width of a lower portion of the gate poly. The example method may also include, between forming the inner spacer and forming the gate poly, forming a halo/pocket implant region on the semiconductor substrate under the opening using an implantation method. In one example, the inner spacer is formed by depositing a spacer film made of a nitride film and patterning the spacer film using an entire surface etching process, and the outer spacer is formed by depositing a spacer film made of an oxide film or a nitride film and patterning the spacer film using an entire surface etching process.

When the inner spacer is formed using the entire surface etching process, the first insulation film disposed under an inside space of the inner spacer may be removed using the entire surface etching process. In this case, when the gate poly is formed, the first insulation film may again be deposited in a portion where the first insulation film has been removed. Alternatively, when the inner spacer is formed using the entire surface etching process, the first insulation film disposed under an inner space of the inner spacer may not be removed.

The second insulation film may be one selected from a group consisting of TEOS (Tetra Ethyl Ortho Silicate), MTO (Middle Temperature Oxide), USG (Undoped Silica Glass) and SiH4-rich oxide, and is removed by a wet etching process using solution containing HF (49%):H2O or NH4F:HF. In one example, the salicide film is made of titanium (Ti), cobalt (Co), or nickel (Ni).

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of fabricating a semiconductor device having a dual spacer, the method comprising:
    depositing first and second insulation films on a semiconductor substrate sequentially and patterning the second insulation film to form an opening;
    forming an inner sparer on an inner wall of the opening such that the inner spacer has a height less than a height of the inner wall of the opening;
    depositing conductive material in the opening and forming a gate poly by planarizing the conductive material such that the gate poly has a wide upper portion defined by a width of the opening and a narrow lower portion defined by the inner spacer;
    removing the second insulation film and forming a lightly doped drain (LDD) using the gate poly and the inner spacer as a mask;
    forming an outer spacer on side walls of the gate poly and the inner spacer;
    forming source/drain regions using the gate poly and the outer sparer as a mask; and
    forming a suicide film on the gate poly and the source/drain regions.

2. A method as defined by claim 1, further comprising forming a halo/pocket implant region on the semiconductor substrate under the opening after forming the inner spacer.

3. A method as defined by claim 1, wherein forming the inner spacer comprises depositing a material on the inner wall of the opening and etching the material such that a height of the inner spacer is less than a height of the opening.

4. A method as defined by claim 1, wherein the gate poly has an upper portion with a width wider than a width of a lower portion of the gate poly.

5. A method as defined by claim 1, wherein forming the inner spacer comprises depositing a nitride film on the inner wall of the opening and patterning the nitride film using an entire surface etching process.

6. A method as defined by claim 5, further comprising removing a portion of the first insulation film disposed under the inner spacer.

7. A method as defined by claim 6, wherein removing the portion of the first insulation film disposed under the inner spacer further comprises exposing a surface of the substrate in the opening.

8. A method as defined by claim 7, further comprising depositing an insulation film on the surface of the semiconductor substrate in the opening.

9. A method as defined by claim 5, wherein forming the outer spacer further comprises depositing an oxide film on the side walls of the gate poly and the inner spacer and patterning the oxide film using a second entire surface etching process.

10. A method as defined by claim 5, wherein forming the second insulation film comprises depositing a material selected from a group consisting of TEOS, MTO, USG and SiH$_4$-rich oxide on the semiconductor substrate.

11. A method as defined by claim 5, wherein the entire surface etching process further comprises removing a portion of the first insulation film disposed under the inner spacer.

12. A method as defined by claim 5, wherein forming the outer spacer further comprises depositing a nitride film on the side walls of the gate poly and the inner spacer and patterning the nitride film using a second entire surface etching process.

13. The method as defined by claim 1, wherein removing the second insulation film comprises a wet etching process.

14. A method as defined by claim 13, wherein the wet etching process comprises applying a solution containing HF (49%):H$_2$O or NH$_4$F:HF to a surface of the second insulation layer.

15. A method as defined by claim 1, wherein depositing the first insulation film comprises depositing an oxide.

16. A method as defined by claim 1, wherein forming the salicide film comprises forming a metal film comprising cobalt, titanium, or nickel on the gate poly, the source/drain regions, and the outer spacer.

17. A method as defined by claim 1, wherein placating the conductive material comprises chemical mechanical polishing of the conductive material.

18. A method as defined by claim 1, wherein depositing the conductive material comprises depositing a polysilicon film.

19. A method as defined by claim 1, wherein patterning the second insulation film to form the opening comprises a dry-etching process.

20. A method as defined by claim 1, further comprising:
    forming a dielectric layer over the gate poly, the source/drain regions, and the outer spacer;
    etching the dielectric layer to form a contact hole over the gate poly;
    forming a tungsten plug in the contact hole; and
    forming a metal wire layer by depositing and patterning a metal film an the dielectric layer.

* * * * *